US010020382B1

(12) United States Patent
Hao et al.

(10) Patent No.: US 10,020,382 B1
(45) Date of Patent: Jul. 10, 2018

(54) METHOD OF MANUFACTURING LOW TEMPERATURE POLY-SILICON ARRAY SUBSTRATE, ARRAY SUBSTRATE, AND DISPLAY PANEL

(71) Applicant: Wuhan China Star Optoelectronics Technology Co., Ltd., Wuhan, Hubei (CN)

(72) Inventors: Xiaodan Hao, Guangdong (CN); Wanting Yin, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 103 days.

(21) Appl. No.: 15/310,140

(22) PCT Filed: Sep. 18, 2016

(86) PCT No.: PCT/CN2016/099215
§ 371 (c)(1),
(2) Date: Nov. 10, 2016

(87) PCT Pub. No.: WO2018/035902
PCT Pub. Date: Mar. 1, 2018

(30) Foreign Application Priority Data

Aug. 24, 2016 (CN) .......................... 2016 1 0717847

(51) Int. Cl.
*H01L 29/786* (2006.01)
*H01L 29/66* (2006.01)
(Continued)

(52) U.S. Cl.
CPC ...... *H01L 29/66757* (2013.01); *G02F 1/1368* (2013.01); *H01L 21/0262* (2013.01); *H01L 21/02532* (2013.01); *H01L 21/02576* (2013.01); *H01L 21/02579* (2013.01); *H01L 21/02592* (2013.01); *H01L 21/02672* (2013.01); *H01L 21/02675* (2013.01); *H01L 21/2254* (2013.01); *H01L 27/1222* (2013.01); *H01L 27/1288* (2013.01); *H01L 29/78633* (2013.01);
(Continued)

(58) Field of Classification Search
CPC ......... H01L 29/66757; H01L 29/78633; H01L 29/78675
See application file for complete search history.

(56) References Cited

U.S. PATENT DOCUMENTS

2008/0119030 A1   5/2008   Kunii
2009/0124077 A1   5/2009   Okada et al.

FOREIGN PATENT DOCUMENTS

CN        1540729         10/2004
CN        104576399 A      4/2015
(Continued)

*Primary Examiner* — Douglas Menz
(74) *Attorney, Agent, or Firm* — Andrew C. Cheng

(57) ABSTRACT

The present disclosure proposes a method of manufacturing a low temperature poly-silicon array substrate, an array substrate and a display panel. The method includes: disposing a substrate, and forming a buffer layer on the substrate; depositing first gas mixture and doped ionized gas by using vapor deposition to form a doped amorphous silicon thin film on the buffer layer; depositing second gas mixture by using vapor deposition to dehydrogenate the amorphous silicon thin film; performing an annealing treatment to the amorphous silicon thin film being dehydrogenated to diffuse dopant ions so as to form a polysilicon layer; and patterning the polysilicon layer.

19 Claims, 3 Drawing Sheets

(51) Int. Cl.
 *H01L 21/02* (2006.01)
 *H01L 27/12* (2006.01)
 *G02F 1/1368* (2006.01)
 *H01L 21/225* (2006.01)
 *G02F 1/1362* (2006.01)

(52) U.S. Cl.
 CPC .. *H01L 29/78675* (2013.01); *G02F 1/136209* (2013.01); *G02F 2001/13685* (2013.01); *G02F 2202/104* (2013.01)

(56) References Cited

FOREIGN PATENT DOCUMENTS

| | | |
|---|---|---|
| CN | 105140130 A | 12/2015 |
| CN | 105304641 A | 2/2016 |

METHOD OF MANUFACTURING LOW TEMPERATURE POLY-SILICON ARRAY SUBSTRATE, ARRAY SUBSTRATE, AND DISPLAY PANEL

BACKGROUND

1. Field of the Disclosure

The present disclosure relates to a liquid crystal display, more particularly, to a method of manufacturing a low temperature poly-silicon array substrate, an array substrate, and a display panel.

2. Description of the Related Art

The low temperature poly-silicon (LTPS) technology is currently rapidly developing. Its biggest advantages are being ultra-thin, being lightweight, and low power consumption, and it can provide brighter colors and clearer images.

During the manufacturing process of an LTPS array substrate, a polysilicon layer is usually formed first, then the channel doping, N-type doping, and P-type doping are performed. Not only are the operational processes excessively complex due to too many processes, but the overall cost for manufacturing processes is also increased because each doping requires one mask.

SUMMARY

The present disclosure provides a method of manufacturing a low temperature poly-silicon array substrate, an array substrate, and a display panel to effectively decrease the number of manufacturing processes of the low temperature poly-silicon array substrate. Less investment in manufacturing equipment is needed to further reduce the manufacturing cost.

The technical solution according to the present disclosure for resolving the above technical problem is: providing a method of manufacturing a low temperature poly-silicon array substrate, the method comprises:

disposing a substrate, and forming a buffer layer on the substrate;

depositing first gas mixture and doped ionized gas by using vapor deposition to form a doped amorphous silicon thin film on the buffer layer;

depositing second gas mixture by using vapor deposition to dehydrogenate the amorphous silicon thin film;

performing an annealing treatment to the amorphous silicon thin film being dehydrogenated to diffuse dopant ions so as to form a polysilicon layer; and patterning the polysilicon layer.

Furthermore, the step of depositing the first gas mixture and the doped ionized gas by using vapor deposition to form the doped amorphous silicon thin film on the buffer layer comprises:

depositing the first gas mixture constituted by SiH4, Ar, and H2 and boron hydride or hydrogen phosphide doped ionized gas by chemical vapor deposition to form the doped amorphous silicon thin film on the buffer layer.

Furthermore, the step of depositing the second gas mixture by using vapor deposition to dehydrogenate the amorphous silicon thin film comprises:

depositing the second gas mixture constituted by hydrogen phosphide or boron hydride by using chemical vapor deposition to dehydrogenate the amorphous silicon thin film.

Furthermore, the step of performing the annealing treatment to the amorphous silicon thin film being dehydrogenated to diffuse the dopant ions so as to form the polysilicon layer comprises:

performing an excimer laser annealing to the amorphous silicon thin film being dehydrogenated to diffuse the dopant ions so as to form the polysilicon layer.

Furthermore, the step of patterning the polysilicon layer comprises:

depositing photoresist on the polysilicon layer, using a masking plate having both a mask and a half-tone mask to expose and develop the photoresist;

etching a phosphor-doped layer of the polysilicon layer according to a shape of the photoresist thus processed to pattern the phosphor-doped layer; and exposing and developing the photoresist again to etch a boron-doped layer underneath the phosphor-doped layer to pattern the boron-doped layer.

Furthermore, the step of disposing the substrate and forming the buffer layer on the substrate comprises:

disposing the first substrate, and forming a light shielding layer on the first substrate;

depositing a SiNx layer on the light shielding layer; and depositing a SiOx layer on the SiNx layer, wherein the SiNx layer and the SiOx layer constitute the buffer layer.

Furthermore, the method further comprises the following steps after the step of patterning the polysilicon layer:

depositing a gate insulating layer on the patterned polysilicon layer, and forming a gate on the gate insulating layer;

depositing an interlayer insulating film on surfaces of the gate and the gate insulating layer, and forming a source and a drain spaced apart from each other by a channel on the interlayer insulating film; and covering a planarization layer on surfaces of the source, the drain, and the interlayer insulating film, and forming an electrode on a surface the planarization layer.

Another technical solution according to the present disclosure for resolving the above technical problem is: providing an array substrate. The array substrate comprises:

a substrate and a buffer layer and a polysilicon layer sequentially formed on the substrate;

wherein the polysilicon layer is formed by depositing first gas mixture and doped ionized gas by chemical vapor deposition to form a doped amorphous silicon thin film on the buffer layer, by depositing second gas mixture by vapor deposition to dehydrogenate the amorphous silicon thin film, and by performing an annealing treatment to diffuse dopant ions.

Furthermore, the polysilicon layer is formed by depositing first gas mixture constituted by SiH4, Ar, and H2 and boron hydride or hydrogen phosphide doped ionized gas by chemical vapor deposition to form a doped amorphous silicon thin film on the buffer layer.

Furthermore, the amorphous silicon thin film is dehydrogenated through depositing second gas mixture constituted by hydrogen phosphide or boron hydride by using chemical vapor deposition.

Furthermore, the polysilicon layer is formed by performing an excimer laser annealing is performed to the amorphous silicon thin film being dehydrogenated to diffuse dopant ions.

Furthermore, the polysilicon layer is patterned through depositing photoresist on the polysilicon layer, using a masking plate having both a mask and a half-tone mask to expose and develop the photoresist; etching a phosphor-doped layer of the polysilicon layer according to a shape of the photoresist thus processed to pattern the phosphor-doped layer; and exposing and developing the photoresist again to etch a boron-doped layer underneath the phosphor-doped layer to pattern the boron-doped layer.

Furthermore, the array substrate further comprises a light shielding layer formed on the substrate, the buffer layer is formed by depositing a SiNx layer on the light shielding layer and depositing a SiOx layer on the SiNx layer so that the buffer layer is constituted by the SiNx layer and the SiOx layer.

Furthermore, the array substrate further comprises: a gate insulating layer deposited on the polysilicon layer; a gate formed on the gate insulating layer; an interlayer insulating film deposited on surfaces of the gate and the gate insulating layer; a source and a drain spaced apart from each other by a channel formed on the interlayer insulating film; a planarization layer covering surfaces of the source, the drain, and the interlayer insulating film; and an electrode formed on a surface the planarization layer.

Another technical solution according to the present disclosure for resolving the above technical problem is: providing a display panel with an array substrate, the display panel comprising the array substrate. The array substrate comprises:

a substrate and a buffer layer and a polysilicon layer sequentially formed on the substrate;

wherein the polysilicon layer is formed by depositing first gas mixture and doped ionized gas by chemical vapor deposition to form a doped amorphous silicon thin film on the buffer layer, by depositing second gas mixture by vapor deposition to dehydrogenate the amorphous silicon thin film, and by performing an annealing treatment to diffuse dopant ions.

Furthermore, the polysilicon layer is formed by depositing first gas mixture constituted by SiH4, Ar, and H2 and boron hydride or hydrogen phosphide doped ionized gas by chemical vapor deposition to form a doped amorphous silicon thin film on the buffer layer.

Furthermore, the amorphous silicon thin film is dehydrogenated through depositing second gas mixture constituted by hydrogen phosphide or boron hydride by using chemical vapor deposition.

Furthermore, the polysilicon layer is formed by performing an excimer laser annealing is performed to the amorphous silicon thin film being dehydrogenated to diffuse dopant ions.

Furthermore, the polysilicon layer is patterned through depositing photoresist on the polysilicon layer, using a masking plate having both a mask and a half-tone mask to expose and develop the photoresist; etching a phosphor-doped layer of the polysilicon layer according to a shape of the photoresist thus processed to pattern the phosphor-doped layer; and exposing and developing the photoresist again to etch a boron-doped layer underneath the phosphor-doped layer to pattern the boron-doped layer.

Furthermore, the array substrate further comprises a light shielding layer formed on the substrate, the buffer layer is formed by depositing a SiNx layer on the light shielding layer and depositing a SiOx layer on the SiNx layer so that the buffer layer is constituted by the SiNx layer and the SiOx layer.

Furthermore, the array substrate further comprises: a gate insulating layer deposited on the polysilicon layer; a gate formed on the gate insulating layer; an interlayer insulating film deposited on surfaces of the gate and the gate insulating layer; a source and a drain spaced apart from each other by a channel formed on the interlayer insulating film; a planarization layer covering surfaces of the source, the drain, and the interlayer insulating film; and an electrode formed on a surface the planarization layer.

Different from the related art, according to the embodiments of the present disclosure, the buffer layer is formed on the substrate, vapor deposition is used to deposit the first gas mixture and the doped ionized gas to form the doped amorphous silicon thin film on the buffer layer; vapor deposition is used to deposit the second gas mixture to dehydrogenate the amorphous silicon thin film; the annealing treatment is performed to the amorphous silicon thin film being dehydrogenated to diffuse the dopant ions so as to form the polysilicon layer, and the polysilicon layer is patterned. The above method in which the first gas mixture and the boron hydride or hydrogen phosphide doped ionized gas are simultaneously introduced to form the doped amorphous silicon thin film can not only simplify the process of introducing gases and save time but also reduce the number of masks that are used. In addition, doping equipment is saved. In addition to that, the doping is performed by introducing gases, which in turn causes a more homogeneous doping to improve the electrical properties of the low temperature poly-silicon array substrate.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
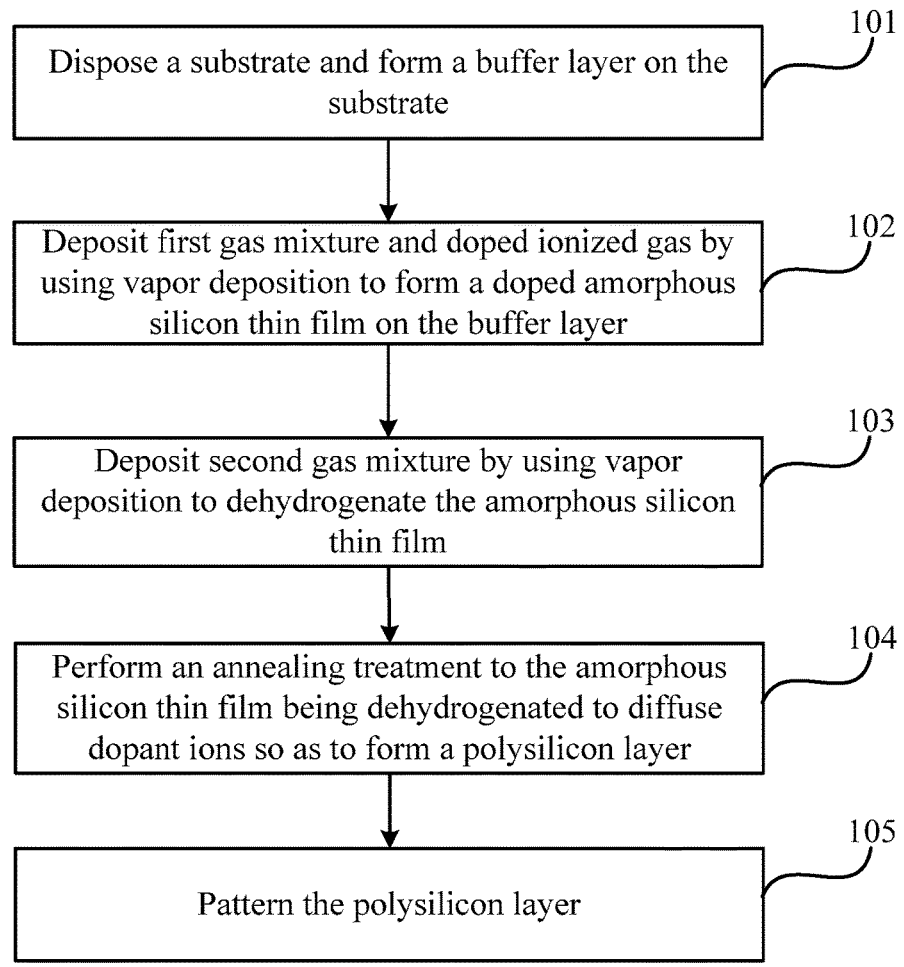
FIG. 1 is a schematic flowchart of a method of manufacturing a low temperature poly-silicon array substrate according to one embodiment of the present disclosure.

Refer to FIG. 1, FIG. 1 is a schematic flowchart of a method of manufacturing a low temperature poly-silicon array substrate according to one embodiment of the present disclosure. Also refer to FIG. 2A-FIG. 2E for schematic diagrams of structures of the low temperature poly-silicon array substrate correspondingly. A manufacturing method according to the present embodiment comprises the following steps:

101: dispose a substrate 200, and form a buffer layer 202 on the substrate 200.

The substrate 200 comprises a glass substrate. In other embodiments, the substrate 200 may be some other substrate, such as a quartz substrate, and the present disclosure is not limited in this regard.

In greater detail, the first substrate 200 is disposed first. A light shielding layer 201 is formed on the first substrate 200. Then a SiNx layer 2021 is deposited on the light shielding layer 201. After that, a SiOx layer 2022 is deposited on the SiNx layer 2021. The SiNx layer 2021 and the SiOx layer 2022 constitute the buffer layer 202.

The light shielding layer 201, the SiNx layer 2021, and the SiOx layer 2022 may be formed by chemical vapor deposition (CVD) or physical vapor deposition (PVD).

102: Deposit first gas mixture and doped ionized gas by using vapor deposition to form a doped amorphous silicon thin film on the buffer layer 202.

In greater detail, the first gas mixture constituted by SiH4, Ar, and H2 and boron hydride or hydrogen phosphide doped ionized gas are deposited by using chemical vapor deposition to form the doped amorphous silicon thin film on the buffer layer 202.

That is, when the first gas mixture is deposited to form an amorphous silicon layer, the boron hydride or hydrogen phosphide doped ionized gas is simultaneously deposited. Each of the different gases passes a channel different from those of the other gases and is mixed after being introduced so as to form an amorphous silicon thin film doped with boron or phosphorus ions on the buffer layer 202. In one embodiment, whether introducing the boron hydride doped ionized gas first or introducing the hydrogen phosphide doped ionized gas first is not limited. In the present embodiment, the boron hydride doped ionized gas being introduced first then the hydrogen phosphide doped ionized gas being introduced is taken as an example for illustration.

In one embodiment, the doped amorphous silicon thin film is formed by using the chemical vapor deposition. However, in other embodiments, the doped amorphous silicon thin film may be formed by using physical vapor deposition, and the present disclosure is not limited in this regard.

The method in which the first gas mixture and the boron hydride or hydrogen phosphide doped ionized gas are simultaneously introduced to form the doped amorphous silicon thin film can not only simplify the process of introducing gases and save time but also reduce the number of masks that are used. In addition, doping equipment is saved. In addition to that, the doping is performed by introducing gases, which in turn causes a more homogeneous doping to improve the electrical properties of the low temperature poly-silicon array substrate.

103: Deposit second gas mixture by using vapor deposition to dehydrogenate the amorphous silicon thin film.

In greater detail, deposit the second gas mixture constituted by hydrogen phosphide or boron hydride on the amorphous silicon thin film formed by the first gas mixture and the doped ionized gas to dehydrogenate the amorphous silicon thin film.

In one embodiment, the second gas mixture constituted by hydrogen phosphide or boron hydride is introduced by chemical vapor deposition. In other embodiments, the second gas mixture constituted by hydrogen phosphide or boron hydride may be introduced by physical vapor deposition, and the present disclosure is not limited in this regard.

104: Perform an annealing treatment to the amorphous silicon thin film being dehydrogenated to diffuse dopant ions so as to form a polysilicon layer 203.

In greater detail, in order to make the lattice of the amorphous silicon thin film being dehydrogenated more homogeneous, the annealing treatment needs to be further performed to the amorphous silicon thin film being dehydrogenated so that the dopant ions diffuse to form the polysilicon layer 203.

Figure 2A:
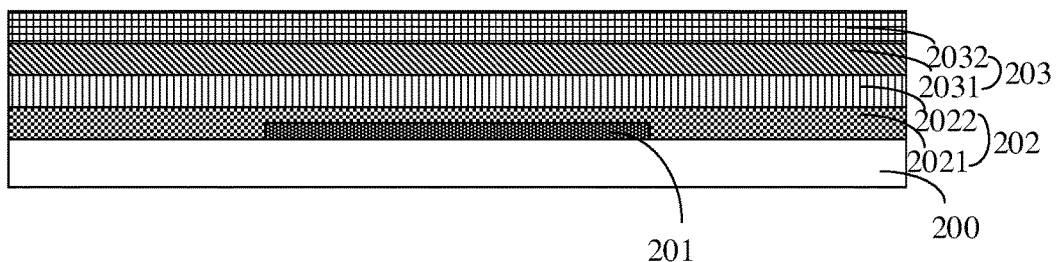
FIG. 2A is a schematic diagram of a structure of the low temperature poly-silicon array substrate in FIG. 1 according to a first embodiment of the present disclosure.

In one embodiment, excimer laser annealing is performed to the amorphous silicon thin film being dehydrogenated so that the dopant ions, that is, boron ions and phosphorus ions, diffuse to form the polysilicon layer 203. As shown in FIG. 2A, a boron-doped layer 2031 and a phosphor-doped layer 2032 are formed.

105: Pattern the polysilicon layer.

Figure 2B:
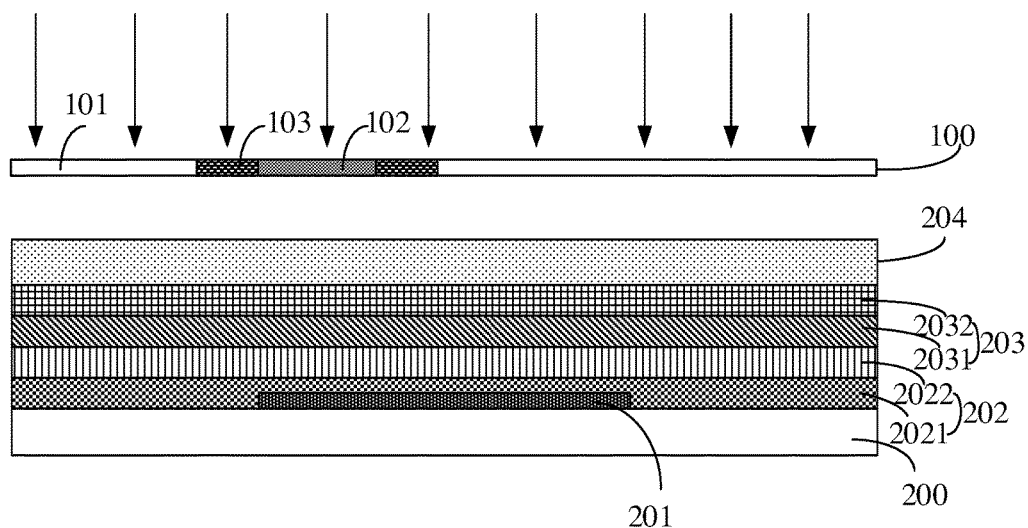
FIG. 2B is a schematic diagram of a structure of the low temperature poly-silicon array substrate in FIG. 1 according to a second embodiment of the present disclosure.
Figure 2C:
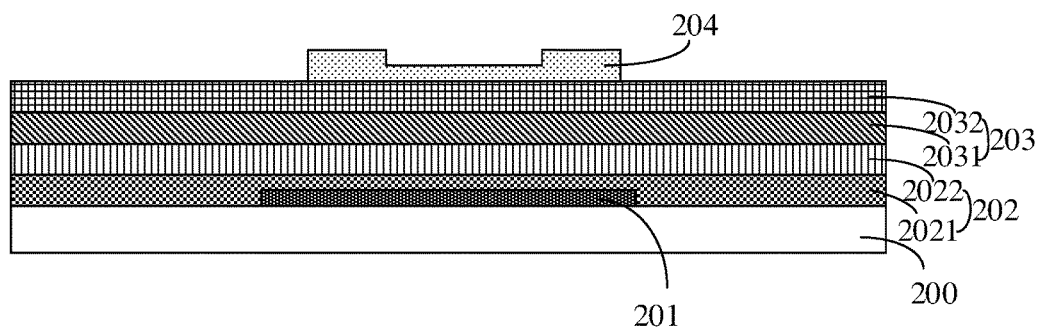
FIG. 2C is a schematic diagram of a structure of the low temperature poly-silicon array substrate in FIG. 1 according to a third embodiment of the present disclosure.

In greater detail, after forming the polysilicon layer 203, photoresist is deposited on the polysilicon layer 203 through chemical vapor deposition or physical vapor deposition so as to form a photoresist layer 204, and the photoresist layer 204 is exposed and developed, as shown in FIG. 2B. In this exposure process, only one mask is required. Through using a special masking plate 100 that has a mask and a half-tone mask, the photoresist is exposed and developed to obtain a predetermined shape shown in FIG. 2C. As shown in FIG. 2B, portions 1011 of the masking plate 100 are a completely light-transmissive mask and light can completely pass through the portions 1011. Portions 1012 are the half-tone mask and only part of light can pass through the portions 1012. Portions 1013 are the mask and light can not pass through the portions 1013 at all. A shape of the masking plate 100 and areas occupied by the various portions may be set depending on practical needs, and the present disclosure is not limited in this regard.

Figure 2D:
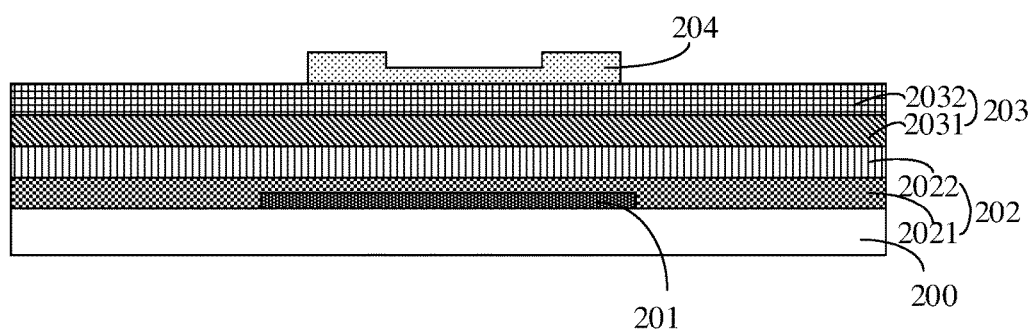
FIG. 2D is a schematic diagram of a structure of the low temperature poly-silicon array substrate in FIG. 1 according to a fourth embodiment of the present disclosure.

Then, the phosphor-doped layer 2032 of the polysilicon layer 203 is etched according to the shape of the photoresist thus processed. As a result, the phosphor-doped layer 2032 is patterned, as shown in FIG. 2D.

Figure 2E:
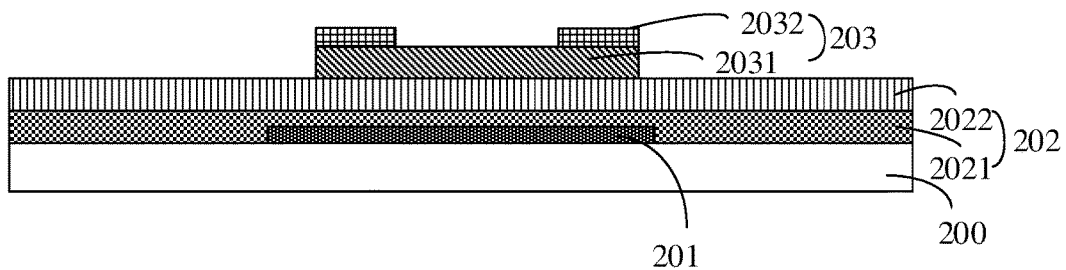
FIG. 2E is a schematic diagram of a structure of the low temperature poly-silicon array substrate in FIG. 1 according to a fifth embodiment of the present disclosure.

The photoresist layer 204 and the phosphor-doped layer 2032 are further exposed and developed, and the phosphor-doped layer 2032 and the boron-doped layer 2031 are etched so that the phosphor-doped layer 2032 and the boron-doped layer 2031 are patterned, as shown in FIG. 2E.

In order to manufacture the complete low temperature poly-silicon array substrate, after the polysilicon layer 203 is patterned, a gate insulating layer is further deposited on the patterned polysilicon layer and a gate is formed on the gate insulating layer.

The gate insulating layer comprises at least one of silicon nitride SiNx and amorphous silicon oxide SiOx. In other embodiments, the gate insulating layer may be some other insulating substance, and the present invention is not limited in this regard.

After that, an interlayer insulating film is deposited on a surface of the gate and the gate insulating layer, and a source and a drain spaced apart from each other by a channel are formed on the interlayer insulating film.

Cover the source, the drain, and the interlayer insulating film with a planarization layer, and an electrode is formed on a surface of the planarization layer.

Different from the related art, according to the embodiments of the present disclosure, the buffer layer is formed on the substrate, vapor deposition is used to deposit the first gas mixture and the doped ionized gas to form the doped amorphous silicon thin film on the buffer layer; vapor deposition is used to deposit the second gas mixture to dehydrogenate the amorphous silicon thin film; the annealing treatment is performed to the amorphous silicon thin film being dehydrogenated to diffuse the dopant ions so as to form the polysilicon layer, and the polysilicon layer is patterned. The above method in which the first gas mixture and the boron hydride or hydrogen phosphide doped ionized gas are simultaneously introduced to form the doped amorphous silicon thin film can not only simplify the process of introducing gases and save time but also reduce the number of masks that are used. In addition, doping equipment is saved. In addition to that, the doping is performed by introducing gases, which in turn causes a more homogeneous doping to improve the electrical properties of the low temperature poly-silicon array substrate.

Figure 3:
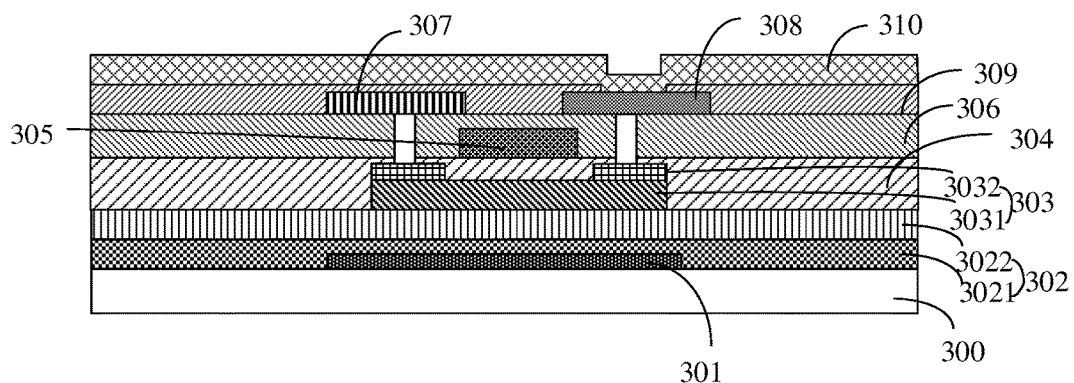
FIG. 3 is a schematic diagram of a structure of an array substrate according to one embodiment of the present disclosure.

Refer to FIG. 3, FIG. 3 is a schematic diagram of a structure of an array substrate according to one embodiment of the present disclosure. As shown in FIG. 3, an array substrate according to the present embodiment includes a substrate 300 and a buffer layer 302 and a polysilicon layer 303 sequentially formed on the substrate 300.

The polysilicon layer 303 is formed by depositing first gas mixture and doped ionized gas by vapor deposition to form a doped amorphous silicon thin film on the buffer layer 302, by depositing second gas mixture by vapor deposition to dehydrogenate the amorphous silicon thin film, and by performing an annealing treatment to diffuse dopant ions.

The substrate 300 comprises a glass substrate. In other embodiments, the substrate 300 may be some other substrate, such as a quartz substrate, and the present disclosure is not limited in this regard. A light shielding layer 301 is formed on the substrate 300. The buffer layer 302 is formed on the light shielding layer 301.

In one embodiment, the buffer layer 302 is formed by depositing a SiNx layer 3021 on the light shielding layer 301 first and then depositing a SiOx layer 3022 on the SiNx layer 3021, and the buffer layer 302 is constituted by the SiNx layer 3021 and the SiOx layer 3022.

The light shielding layer 301, the SiNx layer 3021, and the SiOx layer 3022 may be formed by chemical vapor deposition (CVD) or physical vapor deposition (PVD).

In one embodiment, the polysilicon layer 303 is formed by using the following method: The first gas mixture constituted by SiH4, Ar, and H2 and boron hydride or hydrogen phosphide doped ionized gas are deposited by using chemical vapor deposition to form the doped amorphous silicon thin film on the buffer layer 302. That is, when the first gas mixture is deposited to form an amorphous silicon layer, the boron hydride or hydrogen phosphide doped ionized gas is simultaneously deposited. Each of the different gases passes a channel different from those of the other gases and is mixed when deposition is performed so as to form an amorphous silicon thin film doped with boron or phosphorus ions on the buffer layer 302. After that, the second gas mixture is deposited through chemical vapor deposition to dehydrogenate the amorphous silicon thin film. In greater detail, by depositing the second gas mixture constituted by hydrogen phosphide or boron hydride, the amorphous silicon thin film formed by the first gas mixture and the doped ionized gas is dehydrogenated. Finally, the amorphous silicon thin film being dehydrogenated is annealed to diffuse the dopant ions so as to form the polysilicon layer 303. In greater detail, in order to make the lattice of the amorphous silicon thin film being dehydrogenated more homogeneous, an excimer laser annealing is performed to the amorphous silicon thin film being dehydrogenated so that the dopant ions, that is, boron ions and phosphorus ions, diffuse to form the polysilicon layer 303.

After forming the polysilicon layer 303, in order to form the complete array substrate, the polysilicon layer 303 needs to be patterned. In one embodiment, photoresist is deposited on the polysilicon layer 303 through chemical deposition or physical deposition so as to form a photoresist layer, and the photoresist layer is exposed and developed. In this exposure process, only one mask is required. Through using a special masking plate that has a mask and a half-tone mask, the photoresist is exposed and developed. A shape of the masking plate and areas occupied by various portions may be set depending on practical needs, and the present disclosure is not limited in this regard.

After that, a phosphor-doped layer 3032 of the polysilicon layer 303 is etched according to the shape of the photoresist thus processed. As a result, the phosphor-doped layer 3032 is patterned. The photoresist layer and the phosphor-doped layer 3032 are further exposed and developed, and the phosphor-doped layer 3032 and a boron-doped layer 3031 are etched so that the phosphor-doped layer 3032 and the boron-doped layer 3031 are patterned.

As shown in FIG. 3, the array substrate further comprises a gate insulating layer 304 deposited on the polysilicon layer 303, and a gate 305 on the gate insulating layer 304. The array substrate further comprises an interlayer insulating film 306 covering the gate insulating layer 304 and the gate 305, and a source 307 and a drain 308 spaced apart from each other by a channel on the interlayer insulating film 306. Surfaces of the source 307, the drain 308, and the interlayer insulating film 306 are covered by a planarization layer 309, and an electrode 310 is formed on a surface the planarization layer 309.

Different from the related art, the array substrate according to the embodiments of the present disclosure is formed through the method, in which the first gas mixture and the boron hydride or hydrogen phosphide doped ionized gas are simultaneously introduced to form the doped amorphous silicon thin film. The method can not only simplify the process of introducing gases and save time but also reduce the number of masks that are used. In addition, doping equipment is saved. In addition to that, the doping is performed by introducing gases, which in turn causes a more homogeneous doping to improve the electrical properties of the low temperature poly-silicon array substrate.

Figure 4:
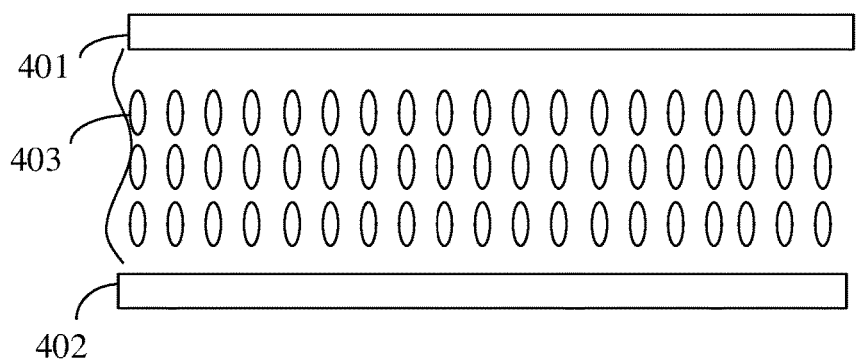
FIG. 4 is a schematic diagram of a structure of a display panel according to one embodiment of the present disclosure.

Refer to FIG. 4, FIG. 4 is a schematic diagram of a structure of a display panel according to one embodiment of the present disclosure. A display panel according to the present embodiment comprises an array substrate 401 and a color filter substrate 402 disposed opposite to each other and a liquid crystal layer 403 disposed between the array substrate 401 and the color filter substrate 402.

The array substrate 401 comprises: a substrate, a buffer layer and a polysilicon layer sequentially formed on the substrate. The polysilicon layer is formed by depositing first gas mixture and doped ionized gas by vapor deposition to form a doped amorphous silicon thin film on the buffer layer, by depositing second gas mixture by vapor deposition to dehydrogenate the amorphous silicon thin film, and by performing an annealing treatment to diffuse dopant ions.

The substrate comprises a glass substrate. In other embodiments, the substrate may be some other substrate, such as a quartz substrate, and the present disclosure is not limited in this regard. A light shielding layer is formed on the substrate. The buffer layer is formed on the light shielding layer.

In one embodiment, the buffer layer is formed by depositing a SiNx layer on the light shielding layer first and then depositing a SiOx layer on the SiNx layer, and the buffer layer is constituted by the SiNx layer and the SiOx layer.

The light shielding layer, the SiNx layer, and the SiOx layer may be formed by chemical vapor deposition (CVD) or physical vapor deposition (PVD).

In one embodiment, the polysilicon layer is formed by using the following method: The first gas mixture constituted by SiH4, Ar, and H2 and boron hydride or hydrogen phosphide doped ionized gas are deposited by using chemical vapor deposition to form the doped amorphous silicon thin film on the buffer layer 302. That is, when the first gas mixture is deposited to form an amorphous silicon layer, the boron hydride or hydrogen phosphide doped ionized gas is simultaneously deposited. Each of the different gases passes a channel different from those of the other gases and is mixed when deposition is performed so as to form an amorphous silicon thin film doped with boron or phosphorus ions on the buffer layer. After that, the second gas mixture is deposited through chemical vapor deposition to dehydrogenate the amorphous silicon thin film. In greater detail, by depositing the second gas mixture constituted by hydrogen phosphide or boron hydride, the amorphous silicon thin film formed by the first gas mixture and the doped ionized gas is dehydrogenated. Finally, the amorphous silicon thin film being dehydrogenated is annealed to diffuse the dopant ions so as to form the polysilicon layer. In greater detail, in order to make the lattice of the amorphous silicon thin film being dehydrogenated more homogeneous, an excimer laser annealing is performed to the amorphous silicon thin film being dehydrogenated so that the dopant ions, that is, boron ions and phosphorus ions, diffuse to form the polysilicon layer.

After forming the polysilicon layer, in order to form the complete array substrate, the polysilicon layer 303 needs to be patterned. In one embodiment, photoresist is deposited on the polysilicon layer 303 through chemical deposition or physical deposition so as to form a photoresist layer, and the photoresist layer is exposed and developed. In this exposure process, only one mask is required. Through using a special masking plate that has a mask and a half-tone mask, the photoresist is exposed and developed. A shape of the masking plate and areas occupied by various portions may be set depending on practical needs, and the present disclosure is not limited in this regard.

After that, a phosphor-doped layer of the polysilicon layer is etched according to the shape of the photoresist thus processed. As a result, the phosphor-doped layer is patterned. The photoresist layer and the phosphor-doped layer are further exposed and developed, and the phosphor-doped layer and a boron-doped layer are etched so that the phosphor-doped layer and the boron-doped layer are patterned.

The array substrate further comprises a gate insulating layer deposited on the polysilicon layer, and a gate on the gate insulating layer. The array substrate further comprises an interlayer insulating film covering the gate insulating layer and the gate, and a source and a drain spaced apart from each other by a channel on the interlayer insulating film. Surfaces of the source, the drain, and the interlayer insulating film are covered by a planarization layer, and an electrode is formed on a surface the planarization layer.

Different from the related art, the array substrate according to the embodiments of the present disclosure is formed through the method, in which the first gas mixture and the boron hydride or hydrogen phosphide doped ionized gas are simultaneously introduced to form the doped amorphous silicon thin film. The method can not only simplify the process of introducing gases and save time but also reduce the number of masks that are used. In addition, doping equipment is saved. In addition to that, the doping is performed by introducing gases, which in turn causes a more homogeneous doping to improve the electrical properties of the low temperature poly-silicon array substrate.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A display panel comprising an array substrate, the array substrate comprises:
    a substrate and a buffer layer and a polysilicon layer sequentially formed on the substrate;
    wherein the polysilicon layer is formed by depositing first gas mixture constituted by SiH4, Ar, and H2 and boron hydride or hydrogen phosphide doped ionized gas by chemical vapor deposition to form a doped amorphous silicon thin film on the buffer layer, by depositing second gas mixture by vapor deposition to dehydrogenate the amorphous silicon thin film, and by performing an annealing treatment to diffuse dopant ions; and
    the array substrate further comprising a gate insulating layer deposited on the polysilicon layer, a gate formed on the gate insulating layer, an interlayer insulating film deposited on surfaces of the gate and the gate insulating layer, a source and a drain spaced apart from each other by a channel formed on the interlayer insulating film, a planarization layer covering surfaces of the source, the drain, and the interlayer insulating film, and an electrode formed on a surface the planarization layer.

2. The display panel as claimed in claim 1, wherein the amorphous silicon thin film is dehydrogenated through depositing second gas mixture constituted by hydrogen phosphide or boron hydride by using chemical vapor deposition.

3. The display panel as claimed in claim 1, wherein the polysilicon layer is formed by performing an excimer laser annealing is performed to the amorphous silicon thin film being dehydrogenated to diffuse dopant ions.

4. The display panel as claimed in claim 1, wherein the polysilicon layer is patterned through depositing photoresist on the polysilicon layer, using a masking plate having both a mask and a half-tone mask to expose and develop the photoresist; etching a phosphor-doped layer of the polysilicon layer according to a shape of the photoresist thus processed to pattern the phosphor-doped layer; and exposing and developing the photoresist again to etch a boron-doped layer underneath the phosphor-doped layer to pattern the boron-doped layer.

5. The display panel as claimed in claim 1, wherein the array substrate further comprises a light shielding layer formed on
    the substrate, the buffer layer is formed by depositing a SiNx layer on the light shielding layer and depositing a SiOx layer on the SiNx layer so that the buffer layer is constituted by the SiNx layer and the SiOx layer.

6. A method of manufacturing a low temperature poly-silicon array substrate, comprising:

disposing a substrate, and forming a buffer layer on the substrate;

depositing first gas mixture and doped ionized gas by using vapor deposition to form a doped amorphous silicon thin film on the buffer layer;

depositing second gas mixture by using vapor deposition to dehydrogenate the amorphous silicon thin film;

performing an annealing treatment to the amorphous silicon thin film being dehydrogenated to diffuse dopant ions so as to form a polysilicon layer; and patterning the polysilicon layer.

7. The method as claimed in claim 6, wherein the step of depositing the first gas mixture and the doped ionized gas by using vapor deposition to form the doped amorphous silicon thin film on the buffer layer comprises:

depositing the first gas mixture constituted by $SiH_4$, Ar, and $H_2$ and boron hydride or hydrogen phosphide doped ionized gas by chemical vapor deposition to form the doped amorphous silicon thin film on the buffer layer.

8. The method as claimed in claim 7, wherein the step of depositing the second gas mixture by using vapor deposition to dehydrogenate the amorphous silicon thin film comprises:

depositing the second gas mixture constituted by hydrogen phosphide or boron hydride by using chemical vapor deposition to dehydrogenate the amorphous silicon thin film.

9. The method as claimed in claim 6, wherein the step of performing the annealing treatment to the amorphous silicon thin film being dehydrogenated to diffuse the dopant ions so as to form the polysilicon layer comprises:

performing an excimer laser annealing to the amorphous silicon thin film being dehydrogenated to diffuse the dopant ions so as to form the polysilicon layer.

10. The method as claimed in claim 6, wherein the step of patterning the polysilicon layer comprises:

depositing photoresist on the polysilicon layer, using a masking plate having both a mask and a half-tone mask to expose and develop the photoresist;

etching a phosphor-doped layer of the polysilicon layer according to a shape of the photoresist thus processed to pattern the phosphor-doped layer; and exposing and developing the photoresist again to etch a boron-doped layer underneath the phosphor-doped layer to pattern the boron-doped layer.

11. The method as claimed in claim 6, wherein the step of disposing the substrate and forming the buffer layer on the substrate comprises:

disposing the first substrate, and forming a light shielding layer on the first substrate;

depositing a $SiN_x$ layer on the light shielding layer; and depositing a $SiO_x$ layer on the $SiN_x$ layer, wherein the $SiN_x$ layer and the $SiO_x$ layer constitute the buffer layer.

12. The method as claimed in claim 6, wherein the method further comprises the following steps after the step of patterning the polysilicon layer:

depositing a gate insulating layer on the patterned polysilicon layer, and forming a gate on the gate insulating layer;

depositing an interlayer insulating film on surfaces of the gate and the gate insulating layer, and forming a source and a drain spaced apart from each other by a channel on the interlayer insulating film; and covering a planarization layer on surfaces of the source, the drain, and the interlayer insulating film, and forming an electrode on a surface the planarization layer.

13. An array substrate comprising:

a substrate and a buffer layer and a polysilicon layer sequentially formed on the substrate;

wherein the polysilicon layer is formed by depositing first gas mixture and doped ionized gas by chemical vapor deposition to form a doped amorphous silicon thin film on the buffer layer, by depositing second gas mixture by vapor deposition to dehydrogenate the amorphous silicon thin film, and by performing an annealing treatment to diffuse dopant ions.

14. The array substrate as claimed in claim 13, wherein the polysilicon layer is formed by depositing first gas mixture constituted by $SiH_4$, Ar, and $H_2$ and boron hydride or hydrogen phosphide doped ionized gas by chemical vapor deposition to form a doped amorphous silicon thin film on the buffer layer.

15. The display panel as claimed in claim 14, wherein the amorphous silicon thin film is dehydrogenated through depositing second gas mixture constituted by hydrogen phosphide or boron hydride by using chemical vapor deposition.

16. The array substrate as claimed in claim 13, wherein the polysilicon layer is formed by performing an excimer laser annealing is performed to the amorphous silicon thin film being dehydrogenated to diffuse dopant ions.

17. The array substrate as claimed in claim 13, wherein the polysilicon layer is patterned through depositing photoresist on the polysilicon layer, using a masking plate having both a mask and a half-tone mask to expose and develop the photoresist; etching a phosphor-doped layer of the polysilicon layer according to a shape of the photoresist thus processed to pattern the phosphor-doped layer; and exposing and developing the photoresist again to etch a boron-doped layer underneath the phosphor-doped layer to pattern the boron-doped layer.

18. The array substrate as claimed in claim 13, wherein the array substrate further comprises a light shielding layer formed on the substrate, the buffer layer is formed by depositing a $SiN_x$ layer on the light shielding layer and depositing a $SiO_x$ layer on the $SiN_x$ layer so that the buffer layer is constituted by the $SiN_x$ layer and the $SiO_x$ layer.

19. The array substrate as claimed in claim 13, further comprising:

a gate insulating layer deposited on the polysilicon layer;

a gate formed on the gate insulating layer; an interlayer insulating film deposited on surfaces of the gate and the gate insulating layer;

a source and a drain spaced apart from each other by a channel formed on the interlayer insulating film;

a planarization layer covering surfaces of the source, the drain, and the interlayer insulating film; and an electrode formed on a surface the planarization layer.

* * * * *